US012646559B2

(12) United States Patent
Chen

(10) Patent No.: US 12,646,559 B2
(45) Date of Patent: Jun. 2, 2026

(54) DYNAMIC RANDOM-ACCESS MEMORY (DRAM) DEVICE

(71) Applicant: NANYA TECHNOLOGY CORPORATION, New Taipei City (TW)

(72) Inventor: Chih-Jen Chen, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 156 days.

(21) Appl. No.: 18/663,115

(22) Filed: May 14, 2024

(65) Prior Publication Data

US 2025/0356908 A1     Nov. 20, 2025

(51) Int. Cl.
*G11C 11/4074*     (2006.01)
*G11C 11/4093*     (2006.01)
*G11C 11/4096*     (2006.01)
*G11C 11/4099*     (2006.01)

(52) U.S. Cl.
CPC ...... *G11C 11/4093* (2013.01); *G11C 11/4096* (2013.01); *G11C 11/4099* (2013.01)

(58) Field of Classification Search
CPC ............ G11C 11/4093; G11C 11/4096; G11C 11/4099
See application file for complete search history.

(56) References Cited

U.S. PATENT DOCUMENTS

2009/0034354 A1*   2/2009   Resnick .................... G11C 5/14
                                                      365/228
2013/0070540 A1*   3/2013   Pyeon .................... G11C 5/147
                                                      327/564

FOREIGN PATENT DOCUMENTS

TW           201333949           8/2013

OTHER PUBLICATIONS

"Office Action of Taiwan Counterpart Application", issued on May 6, 2025, p. 1-p. 12.

* cited by examiner

*Primary Examiner* — Min Huang
(74) *Attorney, Agent, or Firm* — JCIPRNET

(57)                 ABSTRACT

A dynamic random-access memory (DRAM) device is provided. The DRAM device includes slave DRAM chips and a master DRAM chip. Each of the slave DRAM chips includes a slave reference voltage pad, a slave voltage sensor, a slave voltage pump and a slave fuse circuit. The slave voltage sensor senses a voltage value of a reference voltage on the slave reference voltage pad and provides a slave oscillating signal according to the voltage value of a reference voltage on the slave reference voltage pad. The slave voltage pump provides the reference voltage according to the slave oscillating signal. The slave fuse circuit provides a slave set signal according to a slave fuse setting operation of the slave fuse circuit and disables the slave voltage sensor according to the slave set signal. The master DRAM chip controls operations of the slave DRAM chips.

19 Claims, 3 Drawing Sheets

200

111_1

121

DYNAMIC RANDOM-ACCESS MEMORY (DRAM) DEVICE

BACKGROUND

Technical Field

The disclosure generally relates to a memory device, and more particularly to a dynamic random-access memory (DRAM) device.

DESCRIPTION OF RELATED ART

Generally, a dynamic random-access memory (DRAM) device includes memory chips. All of the memory chips operate according to a reference voltage. For example, all of the memory chips may determine a received signal or a received data according to the reference voltage. It should be noted, each of the memory chips need a charge pump and a voltage sensor to generate the reference voltage. Thus, the DRAM device having memory chips has high power consumption. Therefore, how to decrease the power consumption of the DRAM device is one of the research and development focuses of those skilled in the art.

SUMMARY

The disclosure provides a dynamic random-access memory (DRAM) device having low power consumption.

In an embodiment of the disclosure, the DRAM device includes a plurality of slave DRAM chips and a master DRAM chip. Each of the plurality of slave DRAM chips includes a slave reference voltage pad, a slave voltage sensor, a slave voltage pump and a slave fuse circuit. The slave voltage sensor is coupled to the slave reference voltage pad. The slave voltage sensor senses a voltage value of a slave reference voltage on the slave reference voltage pad and provides a slave oscillating signal according to the voltage value of the slave reference voltage on the slave reference voltage. The slave voltage pump is coupled to the slave voltage sensor and the slave reference voltage pad. The slave voltage pump provides the slave reference voltage according to the slave oscillating signal. The slave fuse circuit is coupled to the slave voltage sensor. The slave fuse circuit provides a slave set signal according to a slave fuse setting operation of the slave fuse circuit and disables the slave voltage sensor according to the slave set signal. The master DRAM chip is coupled to the plurality of slave DRAM chips. The master DRAM chip controls operations of the plurality of slave DRAM chips.

Based on the above, the slave fuse circuit disables the slave voltage sensor according to the slave fuse setting operation. The slave voltage pump is also disabled. Therefore, each of the slave DRAM chip disables the slave voltage sensor and the slave voltage pump according to the slave fuse setting operation. In this way, the dynamic DRAM device decreases power consumption according to the slave fuse setting operation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
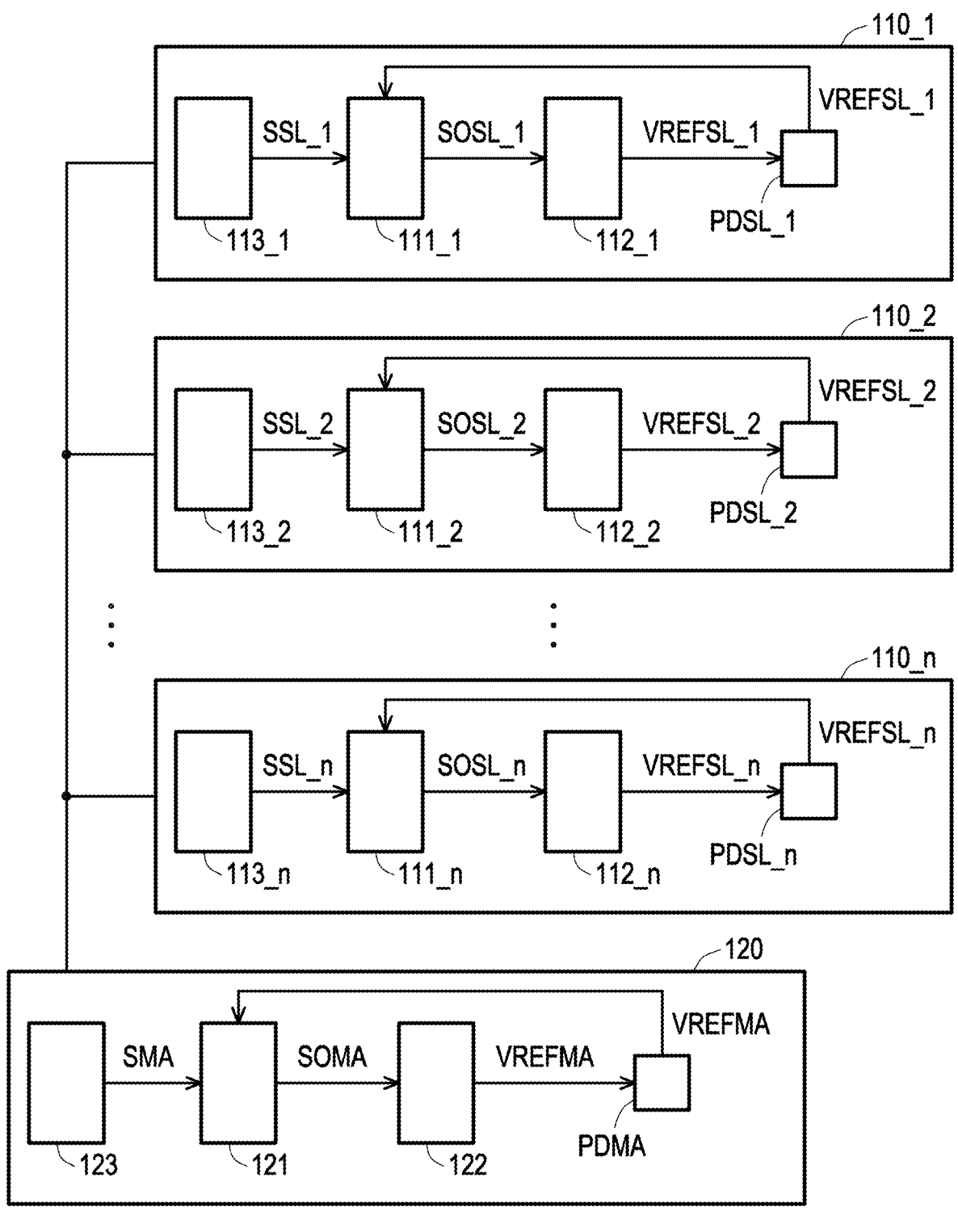
FIG. 1 illustrates a schematic diagram of a dynamic random-access memory (DRAM) device according to an embodiment of the disclosure.

Please refer to FIG. 1, FIG. 1 illustrates a schematic diagram of a dynamic random-access memory (DRAM) device according to an embodiment of the disclosure. In the embodiment, the DRAM device 100 includes slave DRAM chips 110_1 to 110_n and a master DRAM chip 120. The master DRAM chip 120 is coupled to the slave DRAM chips 110_1 to 110_n. In the embodiment, the slave DRAM chip 110_1 includes a slave reference voltage pad PDSL_1, a slave voltage sensor 111_1, a slave voltage pump 112_1 and a slave fuse circuit 113_1. The slave DRAM chip 110_2 includes a slave reference voltage pad PDSL_2, a slave voltage sensor 111_2, a slave voltage pump 112_2 and a slave fuse circuit 113_2. Similarly, the slave DRAM chip 110_n includes a slave reference voltage pad PDSL_n, a slave voltage sensor 111_n, a slave voltage pump 112_n and a slave fuse circuit 113_n.

Taking the slave DRAM chip 110_1 as an example, the slave voltage sensor 111_1 is coupled to the slave reference voltage pad PDSL_1. The slave voltage sensor 111_1 senses a voltage value of a slave reference voltage VREFSL_1 on the slave reference voltage pad PDSL_1. The slave voltage sensor 111_1 provides a slave oscillating signal SOSL_1 according to the voltage value of the slave reference voltage VREFSL_1 on the slave reference voltage PDSL_1. For example, the slave reference voltage VREFSL_1 may be a reference voltage used to determine logic level of a received signal or a received data. For example, the slave reference voltage VREFSL_1 may be a power rail voltage or a driving voltage.

The slave voltage pump 112_1 is coupled to the slave voltage sensor 111_1 and the slave reference voltage pad PDSL_1. The slave voltage pump 112_1 provides the slave reference voltage VREFSL_1 according to the slave oscillating signal SOSL_1.

In the embodiment, the slave oscillating signal SOSL_1 is a signal having a frequency or a duty cycle. The slave voltage sensor 111_1 adjusts the frequency or the duty cycle of the slave oscillating signal SOSL_1 according to the voltage value of the slave reference voltage VREFSL_1 on the slave reference voltage PDSL_1. Thus, the slave voltage pump 112_1 provides the slave reference voltage VREFSL_1 according to the frequency or the duty cycle of the slave oscillating signal SOSL_1.

The slave fuse circuit 113_1 is coupled to the slave voltage sensor 111_1. The slave fuse circuit 113_1 provides a slave set signal SSL_1 according to a slave fuse setting operation of the slave fuse circuit 113_1. The slave fuse circuit 113_1 disables the slave voltage sensor 111_1 according to the slave set signal SSL_1. For example, the slave fuse setting operation is a disable setting operation of the slave DRAM chip 110_1, but the disclosure is not limited thereto. Therefore, the slave voltage sensor 111_1 is disabled by the slave fuse circuit 113_1 when finishing the slave fuse setting operation (for example, the disable setting operation of the slave DRAM chip 110_1 or the slave voltage sensor 111_1).

It should be noted, when the slave voltage sensor 111_1 is disabled, the slave voltage sensor 111_1 stops providing the slave oscillating signal SOSL_1. The slave voltage pump 112_1 is also disabled to stops providing the slave reference voltage VREFSL_1. Therefore, the slave voltage sensor 111_1 and the slave voltage pump 112_1 do not generate power consumption when finishing the slave fuse setting operation. In this way, a power consumption of the slave DRAM chip 110_1 could be decreased according the slave fuse setting operation.

In the embodiment, when the slave fuse circuit 113_1 does not perform the slave fuse setting operation, the slave fuse circuit 113_1 enables the slave voltage sensor 111_1 to sense the voltage value of the slave reference voltage VREFSL_1 on the slave reference voltage pad PDSL_1 and provide the slave oscillating signal SOSL_1.

Taking the slave DRAM chip 110_2 as an example, the slave voltage sensor 111_2 is coupled to the slave reference voltage pad PDSL_2. The slave voltage sensor 111_2 senses a voltage value of a slave reference voltage VREFSL_2 on the slave reference voltage pad PDSL_2. The slave voltage sensor 111_2 provides a slave oscillating signal SOSL_2 according to the voltage value of the slave reference voltage VREFSL_2 on the slave reference voltage PDSL_2.

The slave voltage pump 112_2 is coupled to the slave voltage sensor 111_2 and the slave reference voltage pad PDSL_2. The slave voltage pump 112_2 provides the slave reference voltage VREFSL_2 according to the slave oscillating signal SOSL_2.

The slave fuse circuit 113_2 is coupled to the slave voltage sensor 111_2. The slave fuse circuit 113_2 provides a slave set signal SSL_2 according to a slave fuse setting operation of the slave fuse circuit 113_2. The slave fuse circuit 113_2 disables the slave voltage sensor 111_2 according to the slave set signal SSL_2. Therefore, the slave voltage sensor 111_2 is disabled by the slave fuse circuit 113_2 when finishing the slave fuse setting operation (for example, the disable setting operation of the slave DRAM chip 110_2 or the slave voltage sensor 111_2). When the slave voltage sensor 111_2 is disabled, the slave voltage pump 112_2 is also disabled to stops providing the slave reference voltage VREFSL_2. Therefore, the slave voltage sensor 111_2 and the slave voltage pump 112_2 do not generate power consumption when finishing the slave fuse setting operation. In this way, a power consumption of the slave DRAM chip 110_2 could be decreased according the slave fuse setting operation.

In the embodiment, when the slave fuse circuit 113_2 does not perform the slave fuse setting operation, the slave fuse circuit 113_2 enables the slave voltage sensor 111_2 to sense the voltage value of the slave reference voltage VREFSL_2 on the slave reference voltage pad PDSL_2 and provide the slave oscillating signal SOSL_2.

Taking the slave DRAM chip 110_n as an example, the slave voltage sensor 111_n is coupled to the slave reference voltage pad PDSL_n. The slave voltage sensor 111_n senses a voltage value of a slave reference voltage VREFSL_n on the slave reference voltage pad PDSL_n. The slave voltage sensor 111_n provides a slave oscillating signal SOSL_n according to the voltage value of the slave reference voltage VREFSL_n on the slave reference voltage PDSL_n.

The slave voltage pump 112_n is coupled to the slave voltage sensor 111_n and the slave reference voltage pad PDSL_n. The slave voltage pump 112_n provides the slave reference voltage VREFSL_n according to the slave oscillating signal SOSL_n.

The slave fuse circuit 113_n is coupled to the slave voltage sensor 111_n. The slave fuse circuit 113_n provides a slave set signal SSL_n according to a slave fuse setting operation of the slave fuse circuit 113_n. The slave fuse circuit 113_n disables the slave voltage sensor 111_n according to the slave set signal SSL_n. Therefore, the slave voltage sensor 111_n is disabled by the slave fuse circuit 113_n when finishing the slave fuse setting operation (for example, the disable setting operation of the slave DRAM chip 110_n or the slave voltage sensor 111_n). When the slave voltage sensor 111_n is disabled, the slave voltage pump 112_n is also disabled to stops providing the slave reference voltage VREFSL_n. Therefore, a power consumption of the slave DRAM chip 110_n could be decreased according the slave fuse setting operation.

In the embodiment, when the slave fuse circuit 113_n does not perform the slave fuse setting operation, the slave fuse circuit 113_n enables the slave voltage sensor 111_n to sense the voltage value of the slave reference voltage VREFSL_n on the slave reference voltage pad PDSL_n and provide the slave oscillating signal SOSL_n.

In the embodiment, the master DRAM chip 120 controls operations of the slave DRAM chips 110_1 to 110_n. For example, the master DRAM chip 120 controls write operation and read operation of the slave DRAM chips 110_1 to 110_n, but the disclosure is not limited thereto.

In the embodiment, the master DRAM chip 120 includes a master reference voltage pad PDMA, a master voltage sensor 121, a master voltage pump 122 and a master fuse circuit 123. The master voltage sensor 121 is coupled to the master reference voltage pad PDMA. The master voltage sensor 121 senses a voltage value of a master reference voltage VREFMA on the master reference voltage pad PDMA. The master voltage sensor 121 provides a master oscillating signal SOMA according to the voltage value of the master reference voltage VREFMA on the master reference voltage pad PDMA.

The master voltage pump 122 is coupled to the master voltage sensor 121 and the master reference voltage pad PDMA. The master voltage pump 122 provides the master reference voltage VREFMA according to the master oscillating signal SOMA.

In the embodiment, the master oscillating signal SOMA is a signal having a frequency or a duty cycle. The master voltage sensor 121 adjusts the frequency or the duty cycle of the master oscillating signal SOMA according to the voltage value of the master reference voltage VREFMA on the master reference voltage PDMA. Thus, the master voltage pump 121 provides the master reference voltage VREFMA according to the frequency or the duty cycle of the master oscillating signal SOMA.

The master fuse circuit 123 is coupled to the master voltage sensor 121. The master fuse circuit 123 provides a master set signal SMA according to a master fuse setting operation of the master fuse circuit 123 and disables the master voltage sensor 121 according to the master set signal SMA. For example, the master fuse setting operation is a disable setting operation of the master DRAM chip 120, but the disclosure is not limited thereto. Therefore, the master voltage sensor 121 is disabled by the master fuse circuit 123 when finishing the master fuse setting operation (for example, the disable setting operation of the master DRAM chip 120 or the slave voltage sensor 121).

It should be noted, when the master voltage sensor 121 is disabled, the master voltage sensor 121 stops providing the master oscillating signal SOMA. The master voltage pump 122 is also disabled to stops providing the master reference voltage VREFMA. Therefore, the master voltage sensor 121 and the master voltage pump 122 do not generate power consumption when finishing the master fuse setting operation. In this way, a power consumption of the master DRAM chip 120 could be decreased according the master fuse setting operation.

In the embodiment, when the master fuse circuit 123 does not perform the master fuse setting operation, the master fuse circuit 123 enables the master voltage sensor 121 to sense the voltage value of the master reference voltage VREFMA on the master reference voltage pad PDMA and provide the master oscillating signal SOMA.

In the embodiment, the slave DRAM chips 110_1 to 110_n and the master DRAM chip 120 are stacked from each other. For example, the slave DRAM chips 110_1 to 110_n and the master DRAM chip 120 are stacked to form a three-dimensional (3D) stacked DRAM structure.

Figure 2:
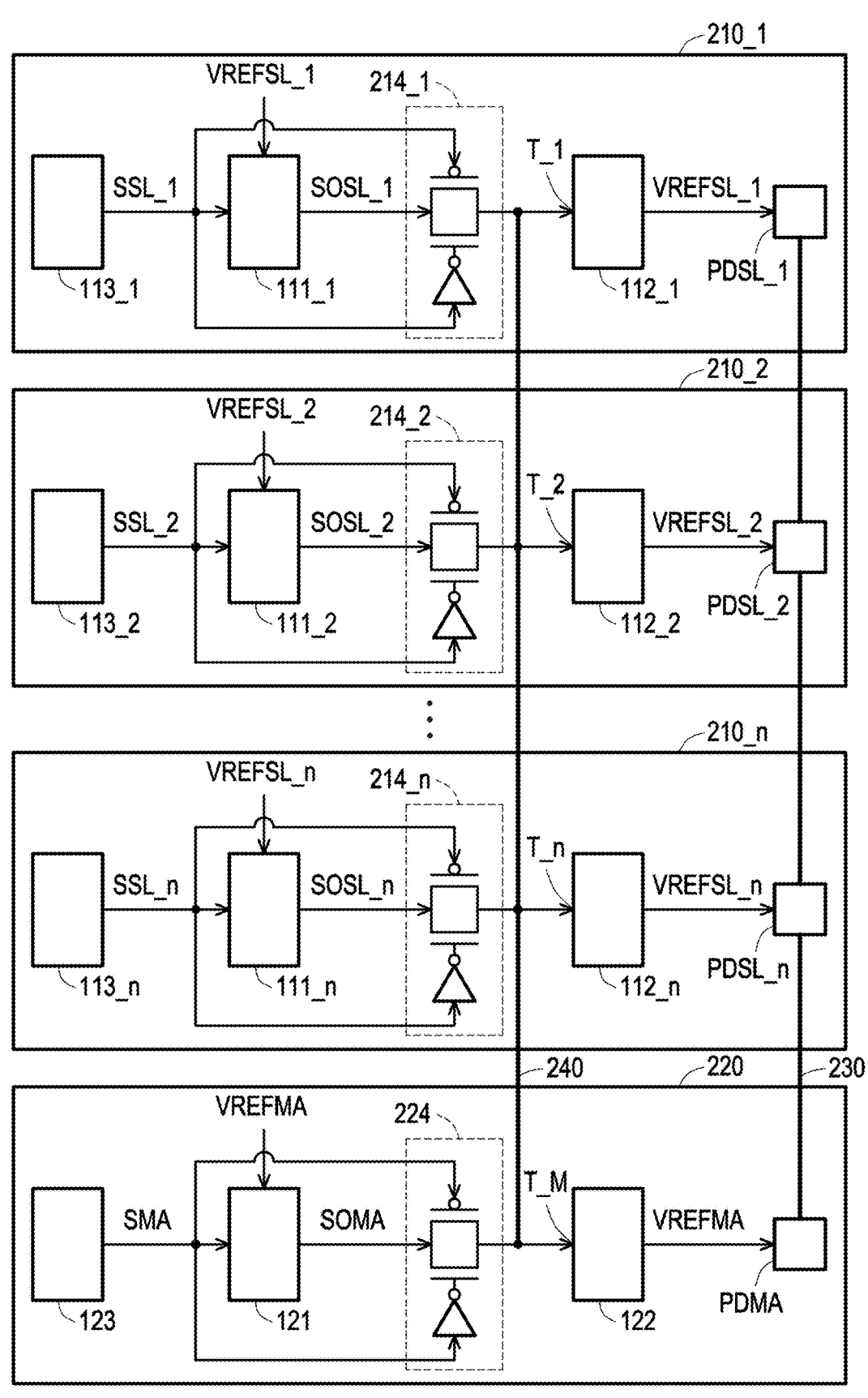
FIG. 2 illustrates a schematic diagram of a dynamic random-access memory (DRAM) device according to an embodiment of the disclosure.

Please refer to FIG. 2, FIG. 2 illustrates a schematic diagram of a dynamic random-access memory (DRAM) device according to an embodiment of the disclosure. In the embodiment, the DRAM device 200 includes slave DRAM chips 210_1 to 210_n and a master DRAM chip 220. The master DRAM chip 220 is coupled to the slave DRAM chips 210_1 to 210_n. In the embodiment, the slave DRAM chip 210_1 includes the slave reference voltage pad PDSL_1, the slave voltage sensor 111_1, the slave voltage pump 112_1, the slave fuse circuit 113_1 and a slave transmission switch 214_1. The slave DRAM chip 210_2 includes the slave reference voltage pad PDSL_2, the slave voltage sensor 111_2, the slave voltage pump 112_2, the slave fuse circuit 113_2 and a slave transmission switch 214_2. Similarly, the slave DRAM chip 210_n includes the slave reference voltage pad PDSL_n, the slave voltage sensor 111_n, the slave voltage pump 112_n, the slave fuse circuit 113_n and a slave transmission switch 214_n.

Taking the slave DRAM chip 210_1 as an example, the operation of the slave voltage sensor 111_1, the slave voltage pump 112_1 and the slave fuse circuit 113_1 has been clearly explained in the embodiments of FIG. 1, so it will not be repeated here. A first terminal of the slave transmission switch 214_1 is coupled to the slave voltage sensor 111_1. A second terminal of the slave transmission switch 214_1 is coupled to the slave voltage pump 112_1, a control terminal of the slave transmission switch 214_1 receives the slave set signal SSL_1 from the slave fuse circuit 113_1. When the slave fuse circuit 113_1 does not perform the slave fuse setting operation, the slave fuse circuit 113_1 turns on the slave transmission switch 214_1 by the slave set signal SSL_1, so as to let the slave transmission switch 214_1 transmit the slave oscillating signal SOSL_1 to the slave voltage pump 112_1. When the slave fuse circuit 113_1 finishes the slave fuse setting operation, the slave fuse circuit 113_1 disables the slave voltage sensor 111_1 and turns off the slave transmission switch 214_1.

Taking the slave DRAM chip 210_2 as an example, the operation of the slave voltage sensor 111_2, the slave voltage pump 112_2 and the slave fuse circuit 113_2 has been clearly explained in the embodiments of FIG. 1, so it will not be repeated here. A first terminal of the slave transmission switch 214_2 is coupled to the slave voltage sensor 111_2. A second terminal of the slave transmission switch 214_2 is coupled to the slave voltage pump 112_2, a control terminal of the slave transmission switch 214_2 receives the slave set signal SSL_2 from the slave fuse circuit 113_2. When the slave fuse circuit 113_2 does not perform the slave fuse setting operation, the slave fuse circuit 113_2 turns on the slave transmission switch 214_2 by the slave set signal SSL_2, so as to let the slave transmission switch 214_2 transmit the slave oscillating signal SOSL_2 to the slave voltage pump 112_2. When the slave fuse circuit 113_2 finishes the slave fuse setting operation, the slave fuse circuit 113_2 disables the slave voltage sensor 111_2 and turns off the slave transmission switch 214_2.

Taking the slave DRAM chip 210_n as an example, the operation of the slave voltage sensor 111_n, the slave voltage pump 112_n and the slave fuse circuit 113_n has been clearly explained in the embodiments of FIG. 1, so it will not be repeated here. A first terminal of the slave transmission switch 214_n is coupled to the slave voltage sensor 111_n. A second terminal of the slave transmission switch 214_n is coupled to the slave voltage pump 112_n, a control terminal of the slave transmission switch 214_n receives the slave set signal SSL_n from the slave fuse circuit 113_n. When the slave fuse circuit 113_n does not perform the slave fuse setting operation, the slave fuse circuit 113_n turns on the slave transmission switch 214_n by the slave set signal SSL_n, so as to let the slave transmission switch 214_n transmit the slave oscillating signal SOSL_n to the slave voltage pump 112_n. When the slave fuse circuit 113_n finishes the slave fuse setting operation, the slave fuse circuit 113_*n* disables the slave voltage sensor 111_*n* and turns off the slave transmission switch 214_*n*.

In the embodiment, the master DRAM chip 220 includes the master reference voltage pad PDMA, the master voltage sensor 121, the master voltage pump 122, the master fuse circuit 123 and a master transmission switch 224. The operation of the master voltage sensor 121, the master voltage pump 122 and the master fuse circuit 123 has been clearly explained in the embodiments of FIG. 1, so it will not be repeated here.

A first terminal of the master transmission switch 224 is coupled to the master voltage sensor 121. A second terminal of the master transmission switch 224 is coupled to the master voltage pump 122. A control terminal of the master transmission switch 224 receives the master set signal SMA from the master fuse circuit 123. When the master fuse circuit 123 does not perform the master fuse setting operation, the master fuse circuit 123 turns on the master transmission switch 224, so as to let the master transmission switch 224 transmit the master oscillating signal to the master voltage pump 122. When the master fuse circuit 123 finishes the master fuse setting operation, the master fuse circuit 123 disables the master voltage sensor 121 and turns off the master transmission switch 224.

In the embodiment, each of the slave transmission switches 214_1 to 214_*n* and the master transmission switch 224 is a switch circuit including a transmission gate and an inverter, but the disclosure is not limited thereto. In some embodiments, each of the slave transmission switches 214_1 to 214_*n* and the master transmission switch 224 may be implemented by at least transistor, but the disclosure is not limited thereto.

In the embodiment, the DRAM device 200 further includes a pad connecting structure 230 and a signal connecting structure 240. The slave reference voltage pads PDSL_1 to PDSL_n and the master reference voltage pad PDMA are connected through the pad connecting structure 230. Therefore, the slave reference voltages VREFSL_1 to VREFSL_n and the master reference voltages VREFMA are identical to each other. In the embodiment, the slave voltage pump 112_1 receives the slave oscillating signal SOSL_1 through an input terminal T_1. The slave voltage pump 112_2 receives the slave oscillating signal SOSL_2 through an input terminal T_2. The slave voltage pump 112_*n* receives the slave oscillating signal SOSL_n through an input terminal T_n. The master voltage pump 122 receives the master oscillating signal SOMA through an input terminal T_M. The input terminals T_1 to T_n and input terminal T_M are connected through signal connecting structure 240.

It should be noted, in the embodiment, an amount of operations of the slave voltage sensors 111_1 to 111_*n* and the master voltage sensor 121 can be adjusted by the slave fuse setting operations and/or the master fuse setting operation. For example, based on the slave fuse setting operations of the slave DRAM chips 210_1 to 210_*n*, the slave voltage sensor 111_1 to 111_*n* are disabled to decrease the power consumption. The slave transmission switches 214_1 to 214_*n* are turned off. The master voltage sensor 121 is enabled to provide the master oscillating signal SOMA. The master transmission switch 224 is turned on to transmit the master oscillating signal SOMA to the input terminals T_1 to T_n. Therefore, the slave voltage pumps 112_1 to 112_*n* and the master voltage pump 122 still operate in response to the master oscillating signal SOMA. For another example, based on the slave fuse setting operations of the slave DRAM chips 210_2 to 210_*n* and the master fuse setting operations of the master DRAM chip 220, the slave voltage pumps 112_1 to 112_*n* and the master voltage pump 122 still operate in response to the slave oscillating signal SOSL_1.

In the embodiment, each of the pad connecting structure 230 and the signal connecting structure 240 may be implemented by at least one through silicon via (TSV) structure, but the disclosure is not limited thereto.

Figure 3:
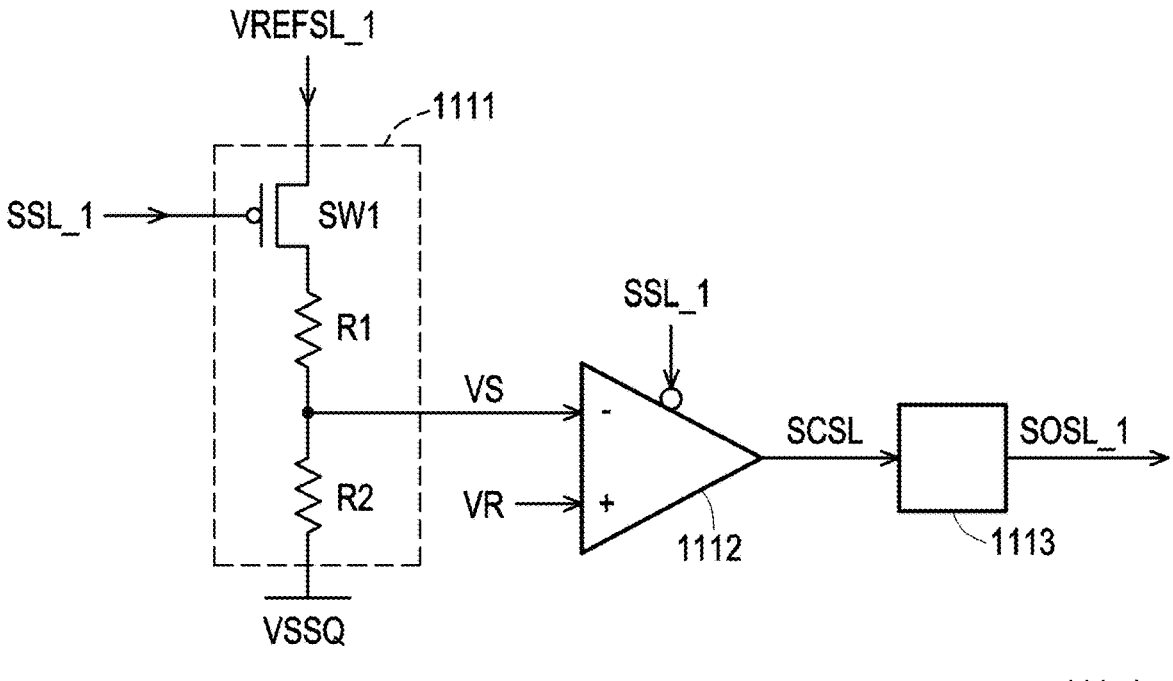
FIG. 3 illustrates a schematic diagram of a slave voltage sensor according to an embodiment of the disclosure.

Please refer to FIG. 1 and FIG. 3, FIG. 3 illustrates a schematic diagram of a slave voltage sensor according to an embodiment of the disclosure. In the embodiment, the slave voltage sensor 111_1 includes a slave sensing voltage generator 1111, a slave comparator 1112 and a slave oscillator 1113. The slave sensing voltage generator 1111 is coupled to the slave reference voltage pad PDSL_1. The slave sensing voltage generator 1111 provides a sensing voltage VS according to the voltage value of the slave reference voltage VREFSL_1 and the slave set signal SSL_1. The slave comparator 1112 is coupled to the slave sensing voltage generator 1111. The slave comparator 1112 provides a slave control signal SCSL according to the sensing voltage VS, a reference voltage VR and the slave set signal SSL_1. The slave oscillator 1113 is coupled to the slave comparator 1112. The slave oscillator 1113 provides the slave oscillating signal SOSL_1 according to the slave control signal SCSL.

When the slave fuse circuit 113_1 finishes the slave fuse setting operation, the slave fuse circuit 113_1 disables the slave sensing voltage generator 1111 and the slave comparator 1112 by the slave set signal SSL_1. For example, when the slave fuse circuit 113_1 finishes the slave fuse setting operation, the slave fuse circuit 113_1 disables the slave sensing voltage generator 1111 and the slave comparator 1112 by the slave set signal SSL_1 having a first voltage level (for example, high voltage level). Therefore, the slave oscillator 1113 does not provide the slave oscillating signal SOSL_1.

When the slave fuse circuit 113_1 does not perform the slave fuse setting operation, the slave fuse circuit 113_1 enables the slave sensing voltage generator 1111 and the slave comparator 1112 by the slave set signal SSL_1 having a second voltage level (for example, low voltage level). Therefore, the slave oscillator 1113 provides the slave oscillating signal SOSL_1 in response to the slave control signal SCSL.

In the embodiment, the slave sensing voltage generator 1111 includes a slave switch SW1 and slave resistors R1 and R2. A first terminal of the slave switch SW1 is coupled to the slave reference voltage pad PDSL_1. The first terminal of the slave switch SW1 receives the voltage value of the slave reference voltage VREFSL_1 on the slave reference voltage pad PDSL_1. A control terminal of the slave switch SW1 is coupled to the slave fuse circuit 113_1. A first terminal of the slave resistor R1 is coupled to a second terminal of the slave switch SW1. A second terminal of the slave resistor R1 outputs the sensing voltage VS. The second slave resistor R2 is coupled between the second terminal of the slave resistor R1 and a reference low voltage VSSQ. In the embodiment, the slave switch SW1 may be implemented by P-type transistor, but the disclosure is not limited thereto.

In the embodiment, when the slave fuse circuit 113_1 does not perform the slave fuse setting operation, the slave switch SW1 is turned on. When the slave fuse circuit 113_1 finishes the slave fuse setting operation, the slave switch SW1 is turned off. For example, when the slave fuse circuit 113_1 does not perform the slave fuse setting operation, the slave fuse circuit 113_1 provides the slave set signal SSL_1 having a low voltage level. Therefore, the slave switch SW1 is turned on. The slave sensing voltage generator 1111 generates the sensing voltage VS according to the voltage value of the slave reference voltage VREFSL_1, the reference low voltage VSSQ, a resistance value of the slave resistor R1 and a resistance value of the slave resistor R2. Furthermore, the slave comparator 1112 is enabled in response to the slave set signal SSL_1 having the low voltage level.

In the embodiment, the slave comparator 1112 compares the sensing voltage VS and the reference voltage VR to output the slave control signal SCSL. An inverting input terminal of the slave comparator 1112 receives the sensing voltage VS. A non-inverting input terminal of the slave comparator 1112 receives the reference voltage VR. When a voltage value of the sensing voltage VS is lower than a voltage value of the reference voltage VR, the slave comparator 1112 outputs the slave control signal SCSL to control the slave oscillator 1113. Therefore, the slave oscillator 1113 provides the slave oscillating signal SOSL_1 for pulling up the voltage value of the slave reference voltage VREFSL_1. When the voltage value of the sensing voltage VS is higher than or equal to the voltage value of the reference voltage VR, the slave comparator 1112 stops to output the slave control signal SCSL.

When the slave fuse circuit 113_1 finishes the slave fuse setting operation, the slave fuse circuit 113_1 provides the slave set signal SSL_1 having a high voltage level. Therefore, the slave switch SW1 is turned off. Therefore, the slave sensing voltage generator 1111 does not generate the sensing voltage VS. Furthermore, the slave comparator 1112 is disabled in response to the slave set signal SSL_1 having the high voltage level. Therefore, the slave oscillator 1113 does not provide the slave oscillating signal SOSL_1.

Figure 4:
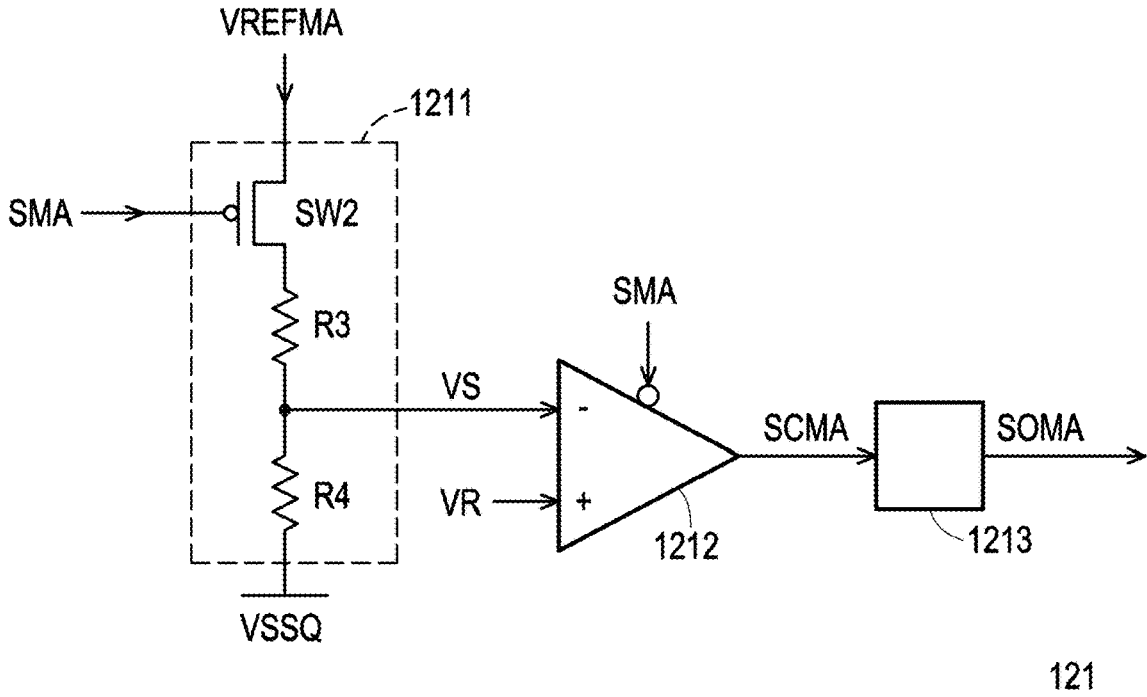
FIG. 4 illustrates a schematic diagram of a master voltage sensor according to an embodiment of the disclosure.

Please refer to FIG. 1 and FIG. 4, FIG. 4 illustrates a schematic diagram of a master voltage sensor according to an embodiment of the disclosure. In the embodiment, the master voltage sensor 121 includes a master sensing voltage generator 1211, a master comparator 1212 and a master oscillator 1213. The master sensing voltage generator 1211 is coupled to the master reference voltage pad PDMA. The master sensing voltage generator 1211 provides a sensing voltage VS according to the voltage value of the master reference voltage VREFMA and the master set signal SMA. The master comparator 1212 is coupled to the master sensing voltage generator 1211. The master comparator 1212 provides a master control signal SCMA according to the sensing voltage VS, a reference voltage VR and the master set signal SMA. The master oscillator 1213 is coupled to the master comparator 1212. The master oscillator 1213 provides the master oscillating signal SOMA according to the master control signal SCMA.

When the master fuse circuit 123 finishes the master fuse setting operation, the master fuse circuit 123 disables the master sensing voltage generator 1211 and the master comparator 1212 by the master set signal SMA. For example, when the master fuse circuit 123 finishes the master fuse setting operation, the master fuse circuit 123 disables the master sensing voltage generator 1211 and the master comparator 1212 by the master set signal SMA having the first voltage level. Therefore, the master oscillator 1213 does not provide the master oscillating signal SOMA.

When the master fuse circuit 123 does not perform the master fuse setting operation, the master fuse circuit 123 enables the master sensing voltage generator 1211 and the master comparator 1212 by the master set signal SMA having the second voltage level. Therefore, the master oscillator 1113 provides the master oscillating signal SOMA in response to the master control signal SCMA.

In the embodiment, the master sensing voltage generator 1211 includes a master switch SW2 and master resistors R3 and R4. A first terminal of the master switch SW2 is coupled to the master reference voltage pad PDMA. The first terminal of the master switch SW2 receives the voltage value of the master reference voltage VREFMA on the master reference voltage pad PDMA. A control terminal of the master switch SW2 is coupled to the master fuse circuit 123. A first terminal of the master resistor R3 is coupled to a second terminal of the master switch SW2. A second terminal of the master resistor R3 outputs the sensing voltage VS. The master resistor R4 is coupled between the second terminal of the master resistor R3 and the reference low voltage VSSQ. In the embodiment, the master switch SW2 may be implemented by P-type transistor, but the disclosure is not limited thereto.

In the embodiment, when the master fuse circuit 123 does not perform the master fuse setting operation, the master switch SW2 is turned on. When the master fuse circuit 123 finishes the master fuse setting operation, the master switch SW2 is turned off. For example, when the master fuse circuit 123 does not perform the master fuse setting operation, the master fuse circuit 123 provides the master set signal SMA having the low voltage level. Therefore, the master switch SW2 is turned on. The master sensing voltage generator 1211 generates the sensing voltage VS according to the voltage value of the master reference voltage VREFMA, the reference low voltage VSSQ, a resistance value of the master resistor R3 and a resistance value of the master resistor R4. Furthermore, the master comparator 1212 is enabled in response to the master set signal SMA having the low voltage level.

In the embodiment, the master comparator 1212 compares the sensing voltage VS and the reference voltage VR to output the master control signal SCMA. An inverting input terminal of the master comparator 1212 receives the sensing voltage VS. A non-inverting input terminal of the master comparator 1212 receives the reference voltage VR. When a voltage value of the sensing voltage VS is lower than a voltage value of the reference voltage VR, the master comparator 1212 outputs the master control signal SCMA to control the master oscillator 1213. Therefore, the master oscillator 1213 provides the master oscillating signal SOMA for pulling up the voltage value of the master reference voltage VREFMA. When the voltage value of the sensing voltage VS is higher than or equal to the voltage value of the reference voltage VR, the master comparator 1212 stops to output the master control signal SCMA.

When the master fuse circuit 123 finishes the master fuse setting operation, the master fuse circuit 123 provides the master set signal SMA having a high voltage level. Therefore, the master switch SW2 is turned off. Therefore, the master sensing voltage generator 1211 does not generate the sensing voltage VS. Furthermore, the master comparator 1212 is disabled in response to the master set signal SMA having the high voltage level. Therefore, the master oscillator 1213 does not provide the master oscillating signal SOMA.

In view of the foregoing, the slave fuse circuit disables the slave voltage sensor according to the slave fuse setting operation. The slave voltage pump is also disabled. Therefore, each of the slave DRAM chip disables the slave voltage sensor and the slave voltage pump according to the slave fuse setting operation. In this way, the dynamic DRAM device decreases power consumption according to the slave fuse setting operation. Furthermore, the amount of operations of the slave voltage sensor and the master voltage sensor can be adjusted by the slave fuse setting operations and/or the master fuse setting operation. In this way, the dynamic DRAM device decreases power consumption according to the slave fuse setting operations and/or the master fuse setting operation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A dynamic random-access memory (DRAM) device, comprising:

a plurality of slave DRAM chips, wherein each of the plurality of slave DRAM chips comprises:

a slave reference voltage pad;

a slave voltage sensor, coupled to the slave reference voltage pad, and configured to sense a voltage value of a slave reference voltage on the slave reference voltage pad and provide a slave oscillating signal according to the voltage value of the slave reference voltage on the slave reference voltage pad;

a slave voltage pump, coupled to the slave voltage sensor and the slave reference voltage pad, and configured to provide the slave reference voltage according to the slave oscillating signal;

a slave fuse circuit, coupled to the slave voltage sensor, and configured to provide a slave set signal according to a slave fuse setting operation of the slave fuse circuit and disable the slave voltage sensor according to the slave set signal; and a slave transmission switch, a first terminal of the slave transmission switch is coupled to the slave voltage sensor, a second terminal of the slave transmission switch is coupled to the slave voltage pump, a control terminal of the slave transmission switch receives the slave set signal; and a master DRAM chip, coupled to the plurality of slave DRAM chips, and configured to control operations of the plurality of slave DRAM chips.

2. The DRAM device of claim 1, wherein when the slave fuse circuit does not perform the slave fuse setting operation, the slave fuse circuit enables the slave voltage sensor to sense the voltage value of the slave reference voltage on the slave reference voltage pad and provide the slave oscillating signal.

3. The DRAM device of claim 1, wherein when the slave fuse circuit finishes the slave fuse setting operation, the slave fuse circuit disables the slave voltage sensor.

4. The DRAM device of claim 1, wherein when the slave fuse circuit does not perform the slave fuse setting operation, the slave fuse circuit turns on the slave transmission switch, so as to let the slave transmission switch transmit the slave oscillating signal to the slave voltage pump.

5. The DRAM device of claim 1, wherein when the slave fuse circuit finishes the slave fuse setting operation, the slave fuse circuit turns off the slave transmission switch.

6. The DRAM device of claim 1, wherein the slave voltage sensor comprises:

a slave sensing voltage generator, coupled to the slave reference voltage pad, and configured to provide a sensing voltage according to the voltage value of the slave reference voltage and the slave set signal;

a slave comparator, coupled to the slave sensing voltage generator, and configured to provide a slave control signal according to the sensing voltage, a reference voltage and the slave set signal; and a slave oscillator, coupled to the slave comparator, and configured to provide the slave oscillating signal according to the slave control signal.

7. The DRAM device of claim 6, wherein when the slave fuse circuit finishes the slave fuse setting operation, the slave fuse circuit disables the slave sensing voltage generator and the slave comparator by the slave set signal.

8. The DRAM device of claim 6, wherein the slave sensing voltage generator comprises:

a slave switch, a first terminal of the slave switch receives the voltage value of the slave reference voltage, a control terminal of the slave switch is coupled to the slave fuse circuit;

a first slave resistor, a first terminal of the first slave resistor is coupled to a second terminal of the slave switch, a second terminal of the first slave resistor outputs the sensing voltage; and a second slave resistor, coupled between the second terminal of the first slave resistor and a reference low voltage.

9. The DRAM device of claim 1, wherein the master DRAM chip comprises:

a master reference voltage pad;

a master voltage sensor, coupled to the master reference voltage pad, and configured to sense a voltage value of a master reference voltage on the master reference voltage pad and provide a master oscillating signal according to the voltage value of the master reference voltage on the master reference voltage pad;

a master voltage pump, coupled to the master voltage sensor and the master reference voltage pad, and configured to provide the master reference voltage according to the master oscillating signal; and a master fuse circuit, coupled to the master voltage sensor, and configured to provide a master set signal according to a master fuse setting operation of the master fuse circuit and disable the master voltage sensor according to the master set signal.

10. The DRAM device of claim 9, wherein when the master fuse circuit does not perform the master fuse setting operation, the master fuse circuit enables the master voltage sensor to sense the voltage value of the master reference voltage on the master reference voltage pad and provide the master oscillating signal.

11. The DRAM device of claim 9, wherein when the master fuse circuit finishes the master fuse setting operation, the master fuse circuit disables the master voltage sensor.

12. The DRAM device of claim 9, wherein the master DRAM chip further comprises:

a master transmission switch, a first terminal of the master transmission switch is coupled to the master voltage sensor, a second terminal of the master transmission switch is coupled to the master voltage pump, a control terminal of the master transmission switch receives the master set signal.

13. The DRAM device of claim 12, wherein when the master fuse circuit does not perform the master fuse setting operation, the master fuse circuit turns on the master transmission switch, so as to let the master transmission switch transmit the master oscillating signal to the master voltage pump.

14. The DRAM device of claim 12, wherein when the master fuse circuit finishes the master fuse setting operation, the master fuse circuit turns off the master transmission switch.

15. The DRAM device of claim 9, wherein the master voltage sensor comprises:

a master sensing voltage generator, coupled to the master reference voltage pad, and configured to provide a sensing voltage according to the voltage value of the master reference voltage and the master set signal;

a master comparator, coupled to the master sensing voltage generator, and configured to provide a master control signal according to the sensing voltage, a reference voltage and the master set signal; and a master oscillator, coupled to the master comparator, and configured to provide the master oscillating signal according to the master control signal.

16. The DRAM device of claim 15, wherein when the master fuse circuit finishes the master fuse setting operation, the master fuse circuit disables the master sensing voltage generator and the master comparator by the master set signal.

17. The DRAM device of claim 15, wherein the master sensing voltage generator comprises:

a master switch, a first terminal of the master switch receives the voltage value of the master reference voltage, a control terminal of the master switch is coupled to the master fuse circuit;

a first master resistor, a first terminal of the first master resistor is coupled to a second terminal of the master switch, a second terminal of the first master resistor outputs the sensing voltage; and a second master resistor, coupled between the second terminal of the first master resistor and a reference low voltage.

18. The DRAM device of claim 9, further comprising:

a pad connecting structure, wherein the slave reference voltage pad and the master reference voltage pad are connected through the pad connecting structure.

19. The DRAM device of claim 9, wherein:

the slave voltage pump receives the slave oscillating signal through a first input terminal, the master voltage pump receives the master oscillating signal through a second input terminal, and the DRAM device further comprising:

a signal connecting structure, wherein the first input terminal and the second input terminal are connected through the signal connecting structure.

* * * * *